United States Patent [19]
Bedard et al.

[11] 4,288,530
[45] Sep. 8, 1981

[54] METHOD OF TUNING APPARATUS BY LOW POWER LASER BEAM REMOVAL

[75] Inventors: Brian E. Bedard, Lochmere, N.H.; Gary R. Geller, Plantation, Fla.

[73] Assignee: Motorola, Inc., Schaumburg, Ill.

[21] Appl. No.: 84,941

[22] Filed: Oct. 15, 1979

[51] Int. Cl.³ .............................................. H01P 3/08
[52] U.S. Cl. .................................... 430/315; 29/593; 204/15; 219/121 LM; 333/205; 427/53.1; 427/96; 427/99; 430/319
[58] Field of Search ................. 427/96, 100, 99, 53.1; 430/315, 319; 219/121 LM; 29/593; 204/15

[56] References Cited

U.S. PATENT DOCUMENTS

| | | | |
|---|---|---|---|
| 4,081,653 | 3/1978 | Koo et al. | 279/121 LM |
| 4,112,147 | 9/1978 | Thompson | 427/100 |
| 4,131,484 | 12/1978 | Caruso et al. | 219/121 LM |
| 4,157,517 | 6/1979 | Kneisel et al. | 333/205 |

OTHER PUBLICATIONS

Brauer, "Reproducible Methods for the Fabrication of Microwave Strip Lines . . . ", Solid State Technology, vol. 19, No. 12, pp. 67–73.

Primary Examiner—John D. Smith
Attorney, Agent, or Firm—James W. Gillman; Margaret M. Parker

[57] ABSTRACT

A thin film structure is provided with the capability of low-power laser tuning and trimming. Trim windows in a plated ground plane are incorporated to allow automated tuning procedures using relatively low-power lasers. The trim windows are conductive, but the heavier layer of plated copper is omitted from those areas, leaving only the titanium/evaporated copper/gold layers. The method can also provide for areas of bare substrate if desired.

7 Claims, 23 Drawing Figures

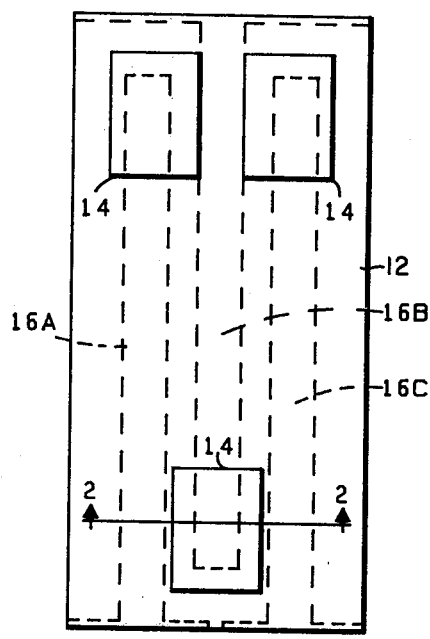
_Fig. 1_
_Fig. 2_
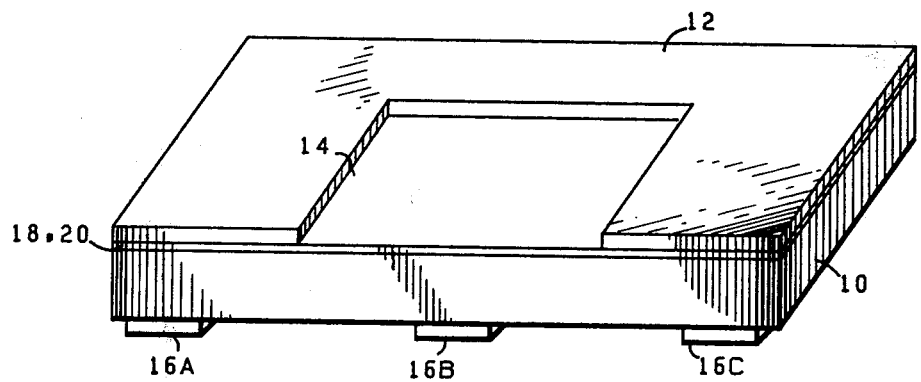

METHOD OF TUNING APPARATUS BY LOW POWER LASER BEAM REMOVAL

BACKGROUND OF THE INVENTION

The present invention relates to the field of metallized substrates for communications applications and, more particularly, to a means of tuning thin film structures such as stripline filters, using automated low-power laser trimming.

Metallization on non-conductive substrates such as ceramics is well known in the art for such circuit components as stripline filters. Such filters typically include a configuration or pattern of conductive elements on one surface of the ceramic plate, these elements interacting with a relatively large area of ground plane on the opposing substrate surface. For electrical reasons, the ground plane is required to be a very low conductivity layer, typically including a heavy (one mil) layer of plated copper. Filters or other such components may require removal of a portion of the conductive ground plane for tuning or other adjustment. Such adjustments have been made by abrasion; i.e., mechanically removing small portions of the ground plane in the appropriate areas, using a diamond grinding wheel or sand trimmer. It will be obvious that such a method does not lend itself to automated trimming procedures, where the circuitry is monitored as it is tuned and the monitoring equipment controls an extremely precise laser beam. Thick film resistors on substrates can be trimmed precisely by low-power (1.8 kw input power) laser beams, but that power is not sufficient to trim a heavily plated ground plane.

SUMMARY OF THE INVENTION

It is therefore an object of the present invention to provide a means of trimming a ground plane or the like with a low-power laser beam.

It is a particular object to provide such a means utilizing standard process steps.

It is another object to provide additionally for removal of all conductive layers on other portions of the substrate.

These objects, and others which will become apparent, are provided in a structure and accompanying method in accordance with the present invention. On a non-conductive wafer, one or more conductive circuit components are formed on a first surface. A conductive layer or ground plane is formed on a substantial portion of the second surface of the wafer opposite at least one element of a circuit component which requires a fine tuning or trimming adjustment. The ground plane will consist of a thin conductive layer, such as copper evaporated over titanium, a heavy conductive layer such as plated copper, and a thin protective layer of a noble metal such as gold. The heavy copper layer will have an aperture opposite at least a portion of the component to be adjusted. Therefore, tuning or trimming can be accomplished by removing discrete areas of the thinner layers within the aperture in the heavy layer, using a relatively low-power laser beam, such as those used to trim thick film resistors.

BRIEF DESCRIPTION OF THE DRAWING

FIG. 1 is a bottom view of a stripline filter substrate.

FIG. 2 is a cut-away, perspective view of a portion of the substrate of FIG. 1, along the line 2—2.

DETAILED DESCRIPTION OF THE PREFERRED EMBODIMENT

Figure 3:
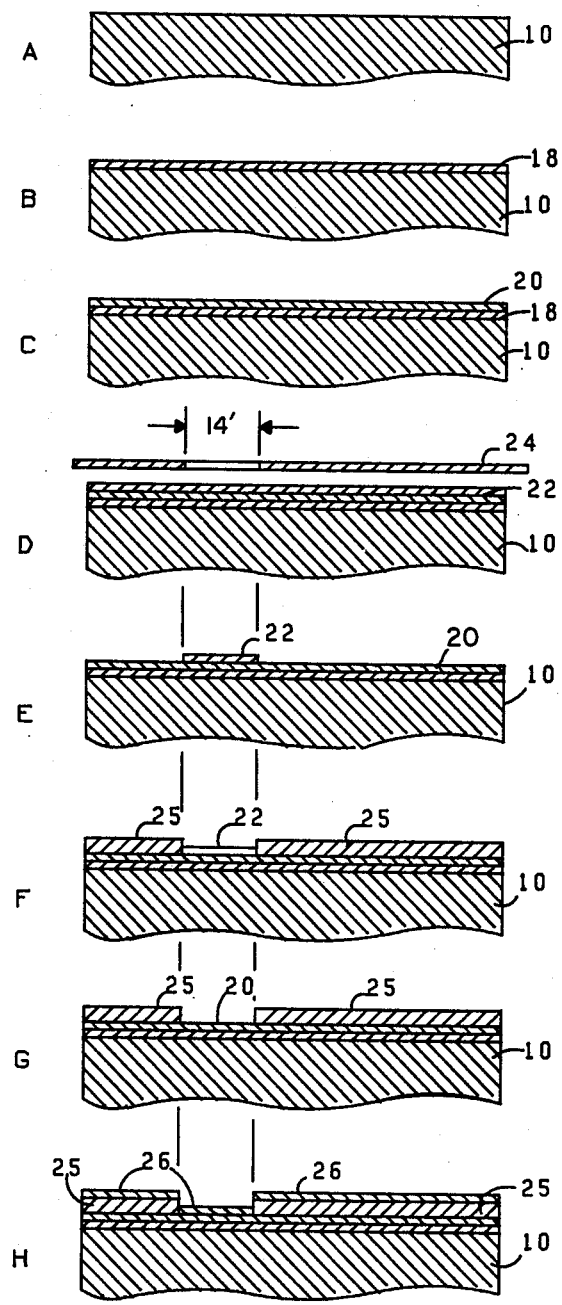
FIG. 3 shows the successive steps in one preferred embodiment of the invention.

For purposes of clarity, the existing thin film process will be briefly described. On a non-conductive substrate, a very thin layer of titanium is deposited first to provide adhesion for the subsequent layers of metal. Next, a thin layer of copper is evaporated over the titanium. A photo-resist is applied and exposed to ultraviolet light through a mask, the unexposed areas resulting eventually in conductive areas. After the resist is developed, the unhardened portions are stripped off and a thick layer of copper is plated on the areas of bare copper. A thin layer of gold is plated on over all, then the hardened resist is stripped from the substrate. Etching subsequently removes all thin layers down to the bare substrate in the desired areas.

As may be seen in the drawing, the invention is used for the fine tuning (trimming) of a stripline filter on a substrate 10 (see FIGS. 2-4) such as a ceramic wafer. In this example, the visible surface of the substrate is covered by a ground plane 12 having three apertures or "trim windows" 14. The other surface of the substrate 10 has on it (as indicated by dashed lines in FIG. 1) elements 16A, 16B and 16C of the filter circuit.

Stripline filters are well known in the art, and have previously been constructed using a layer of heavy copper throughout the ground plane. Tuning or other fine adjustment has been accomplished by use of an abrasion technique using a diamond grinding wheel. No further description of the circuit aspects of the filter will be given here, since the present invention is only concerned with the capability of fine tuning by the removal of discrete areas of the ground plane with a low-power laser beam.

In the cut-away, perspective view of FIG. 2, the filter of FIG. 1 is shown cut along the line 2—2 with the edges of circuit elements 16A, B and C visible on the lower surface (normally considered the top side of the filter). The ground plane 12 and windows 14 are on the upper side of the ceramic wafer 10 in this view and it is apparent that the copper layer within the window 14 is thinner than it is in the adjacent areas. It is to be noted that no attempt has been made to scale any of the drawing figures; instead, typical dimensions are given as appropriate in the text.

FIG. 3 shows a series of progressive steps in producing the ground plane only of one embodiment of the invention. FIG. 3A shows the bare substrate 10 and FIG. 3B shows a very thin (500 Å) added layer 18 of deposited titanium. In FIG. 3C, a thin (10,000 Å) layer 20 of copper has been evaporated over the titanium layer 18. In FIG. 3D, a film 22 of a photo-resist (such as that sold commercially as Riston TM 218R) has been added, and a mask 24 is shown in position to expose the area 14' of the photo-resist film 22 for providing one window 14 (FIGS. 1 and 2). After the photo-resist has been exposed to ultraviolet light through the mask, and developed, the unhardened areas are removed as shown in FIG. 3E. A heavy (0.7 to 1.2 mils) layer 25 of copper is plated on all areas except area 14, as shown in FIG. 3F. The hardened resist 22 is then stripped off, as shown in FIG. 3G. As shown in FIG. 3H, a thin (5000 Å) layer 26 of gold is plated over all exposed copper, both thick and thin layers. In the tuning operation, a low-powered laser beam can be manually or automatically controlled to remove as much of the thin layers of gold and copper in any of the windows 14 as is required; e.g., for tuning a stripline filter.

Figure 4:
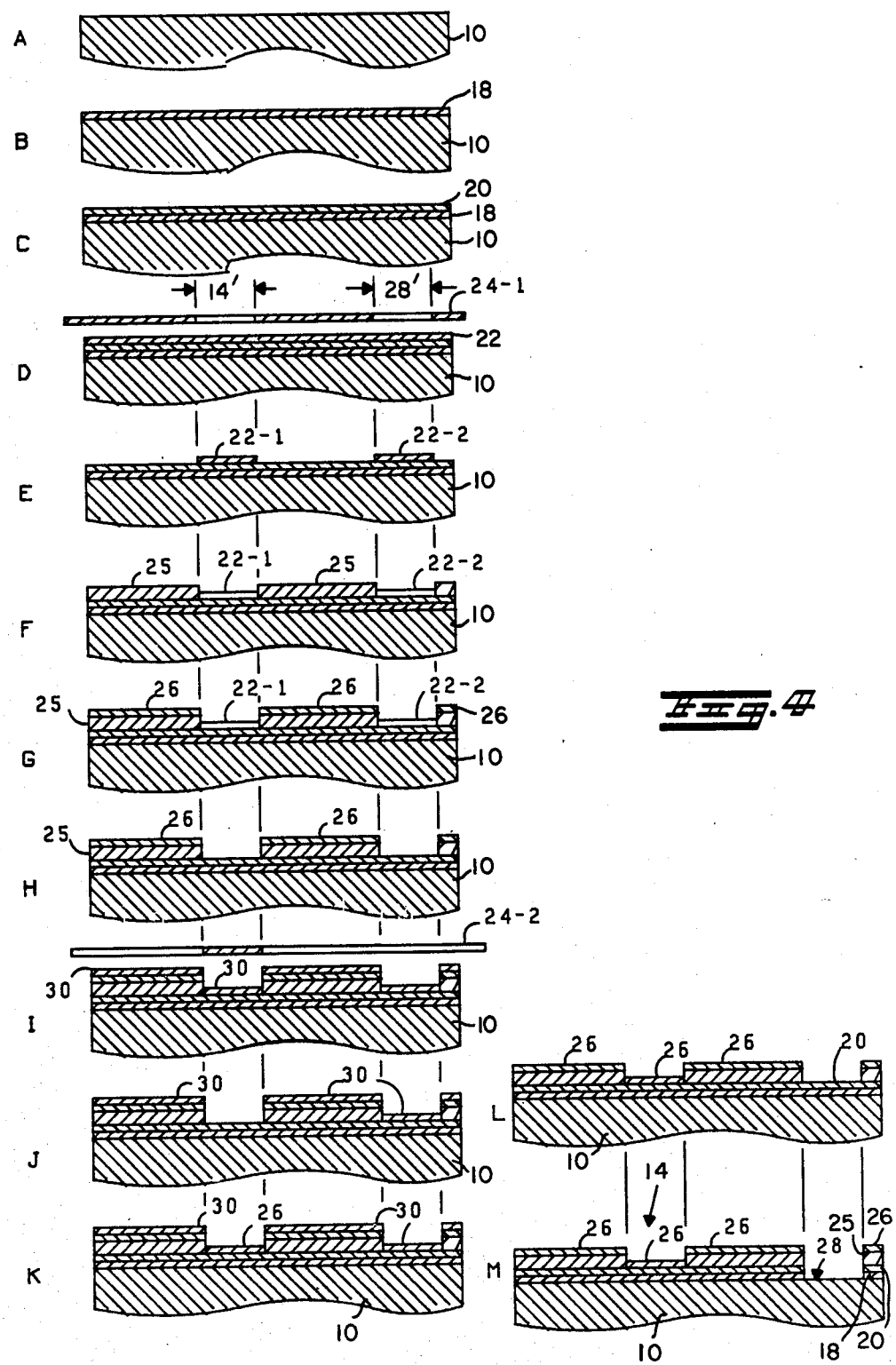
FIG. 4 shows the successive steps in another embodiment, which provides for areas of bare substrate.

In FIG. 4 is seen the series of progressive steps in an alternate embodiment which can provide both the trim windows 14 as shown in FIG. 3 and areas of bare substrate which may be desired for other purposes than tuning.

FIGS. 4A-4D are the same as FIGS. 3A-3D except that the mask 24-1 has an area 14' for providing the window or aperture 14 and another area 28' for providing an area 28 (see FIG. 4M) of bare substrate. After the photo-resist 22 has been exposed to ultraviolet light through the mask 24 and developed, the unhardened resist is removed as in FIG. 4E, leaving areas 22-1 and 22-2. The heavy copper layer 25 is then plated on (FIG. 4F) followed by the thin layer 26 of gold (FIG. 4G). The hardened areas of photo-resist 22 are then stripped off as shown in FIG. 4H, and another layer 30 of the photo-resist is applied over all (FIG. 4I). All areas except area 14' of the photo-resist are exposed through a second mask 24-2, then the photo-resist is developed. After the unhardened resist is removed (FIG. 4J); i.e., the portion in the area 14', that area is plated with gold (layer 26) as shown in FIG. 4K. When the hardened resist is removed (FIG. 4L), all exposed surfaces have been plated with gold except for the area 28'. An etching process (FIG. 4M) will remove the thin copper and titanium layer to provide bare substrate in the area 28'.

Thus there has been shown and described a means of providing a tunable circuit element on a substrate using only the standard process steps, and of tuning the said element with a low-power laser beam. It is intended to cover all modifications and variations which fall within the spirit and scope of the appended claims.

What is claimed is:

1. A method of tuning an apparatus for use in communications equipment comprising the steps of:
   providing a non-conductive wafer;
   providing on a first major surface of said wafer at least one conductive circuit element;
   providing on the second major surface of said substrate a relatively large conductive area having generally a first predetermined thickness and having, opposite the at least one circuit element, a portion of a second predetermined thickness, the second predetermined thickness being substantially thinner than the first predetermined thickness; and
   evaporating appropriate portions of the thinner portion of the large conductive area by means of a low-power laser beam having sufficient energy to evaporate the thinner portions of the conductive areas on the second major surface and insufficient energy to evaporate the thicker portions; thereby altering the capacitance between the conductive elements on the opposing sides of said wafer.

2. A method in accordance with claim 1 wherein the step of evaporating portions of the large conductive area is performed with a laser beam.

3. A method of tuning an apparatus for use in communications equipment comprising the following steps:
   (a) providing a non-conductive wafer;
   (a') providing conductive circuit elements on a first major surface of the wafer;
   (b) evaporating a relatively thin layer of metal onto a second major surface of the wafer;
   (c) covering said thin metal layer with a layer of photo-sensitive material;
   (d) positioning a mask over said photo-sensitive material;
   (e) exposing at least one portion of said photo-sensitive material to radiation through said mask;
   (f) developing said photo-sensitive material;
   (g) removing the uncured portions of said photo-sensitive material;
   (h) plating a relatively heavy layer of metal on those portions of the first metal layer not covered by cured photo-sensitive material;
   (i) removing the cured portions of the photo-sensitive material;
   (j) plating a layer of noble metal over all exposed metal surfaces; and
   (s') tuning the apparatus by evaporating appropriate portions of those areas of metal lacking the relatively heavy plated layer and thereby reducing the capacitance between the opposing metal layers by means of a low-power laser beam having sufficient energy to evaporate the thinner portions of the conductive areas on the second major surface and insufficient energy to evaporate the thicker portions.

4. A method in accordance with claim 3 and wherein the relatively thin layer of metal comprises a layer of titanium and a superimposed layer of copper.

5. A method in accordance with claim 3 wherein the relatively heavy layer of metal is comprised of copper.

6. A method in accordance with claim 3 wherein the noble metal is gold.

7. A method in accordance with claim 3 wherein at least two portions of the layer of photo-sensitive material are exposed to radiation through the first mask and wherein the steps of removing the cured portions of photo-sensitive material and plating with a noble metal are reversed, and further including the steps of:
   (k) covering the surface with a second layer of photo-sensitive material;
   (l) positioning a second mask over said second layer of photo-sensitive material;
   (m) exposing portions of said second layer to radiation through said second mask, said portions excluding at least one area not covered by the heavy layer of metal;
   (n) developing said second layer of photo-sensitive material;
   (o) removing the uncured portions of said second layer of photo-sensitive material;
   (p) plating a second layer of a noble metal over all exposed metal;
   (q) removing all cured portions of said second layer of photo-sensitive material; and
   (r) removing all thin layers of metal not covered by a noble metal.

* * * * *